(12) United States Patent
Chen (10) Patent No.: US 11,362,428 B2
(45) Date of Patent: Jun. 14, 2022

(54) MULTI-BAND SLOT ANTENNA

(71) Applicant: BOSE CORPORATION, Framingham, MA (US)

(72) Inventor: Louis Chen, Bolton, MA (US)

(73) Assignee: BOSE CORPORATION, Framingham, MA (US)

( * ) Notice: Subject to any disclaimer, the term of this patent is extended or adjusted under 35 U.S.C. 154(b) by 378 days.

(21) Appl. No.: 16/565,972

(22) Filed: Sep. 10, 2019

(65) Prior Publication Data

US 2021/0075116 A1 Mar. 11, 2021

(51) Int. Cl.

| | |
|---|---|
| *H01Q 13/10* | (2006.01) |
| *H01Q 1/38* | (2006.01) |
| *H04B 1/3827* | (2015.01) |
| *H04R 1/10* | (2006.01) |
| *H05K 1/02* | (2006.01) |
| *H01K 13/02* | (2006.01) |

(52) U.S. Cl.
CPC ............... *H01Q 13/10* (2013.01); *H01Q 1/38* (2013.01); *H04B 1/3827* (2013.01); *H04R 1/1008* (2013.01); *H05K 1/0216* (2013.01); *H01K 13/02* (2013.01); *H04R 2420/07* (2013.01)

(58) Field of Classification Search
CPC .......... H01Q 13/10; H01Q 13/02; H01Q 1/38; H04B 1/3827; H04R 1/1008; H05K 1/0216

See application file for complete search history.

(56) References Cited

U.S. PATENT DOCUMENTS

| | | | | |
|---|---|---|---|---|
| 2008/0111755 | A1* | 5/2008 | Haziza | H01Q 13/00 343/786 |
| 2009/0153409 | A1 | 6/2009 | Chiang et al. | |
| 2009/0273524 | A1 | 11/2009 | Furuya et al. | |

FOREIGN PATENT DOCUMENTS

| | | |
|---|---|---|
| DE | 102019000259 A1 | 8/2019 |
| EP | 3514886 A1 | 7/2019 |

OTHER PUBLICATIONS

International Search Report and Written Opinion in International Patent Application No. PCT/US2020/049842 dated Nov. 18, 2020.

\* cited by examiner

*Primary Examiner* — Joseph J Lauture (74) *Attorney, Agent, or Firm* — Lando & Anastasi, LLP (57) ABSTRACT

According to at least one aspect of the disclosure, an antenna is provided comprising an excitation port, and a conductive medium including a plurality of slots, each slot of the plurality of slots being electrically coupled to the excitation port, and a base portion being electrically coupled to the excitation port.

19 Claims, 11 Drawing Sheets

MULTI-BAND SLOT ANTENNA

BACKGROUND

1. Field of the Disclosure

At least one example in accordance with the present disclosure relates generally to wireless devices, including wireless headphones.

2. Discussion of Related Art

Wireless headphones may include one or more components to enable wireless communication with an audio source. For example, wireless headphones may include antennas configured to send and receive signals encoding audio information to and from an audio source. In the context of certain wearable wireless headphones, a form factor of the antenna may be restricted by a need for a headphone to fit partially within, around, or near a user's ear canal.

SUMMARY

According to at least one aspect of the present disclosure includes an antenna comprising an excitation port, and a conductive medium including a plurality of slots, each slot of the plurality of slots being electrically coupled to the excitation port, and a base portion being electrically coupled to the excitation port.

In various examples, the antenna includes a printed circuit board (PCB) configured to transmit and receive, via the excitation port, at least one excitation signal to and from the plurality of slots and the base portion. In some examples, the antenna includes a conductive rod electrically coupled to the PCB and to the plurality of slots and the base portion via the excitation port. In at least one example, the PCB is configured to simultaneously transmit the at least one excitation signal to the plurality of slots and the base portion via the conductive rod. In some examples, the base portion is configured to output electromagnetic radiation responsive to receiving the at least one excitation signal.

In at least one example, a first slot of the plurality of slots is configured to output electromagnetic radiation having a first wavelength responsive to receiving a first excitation signal of the at least one excitation signal. In various examples, the first slot is configured to output electromagnetic radiation having a second wavelength responsive to receiving a second excitation signal of the at least one excitation signal. In some examples, the first wavelength is approximately twice the second wavelength. In various examples, first wavelength is approximately four times the second wavelength. In at least one example, a length of the first slot is approximately equal to the first wavelength. In various examples, the length of the first slot is approximately equal to one-half of the second wavelength. In some examples, each slot of the plurality of slots and the base portion is configured to transmit electromagnetic radiation of a respective resonant frequency responsive to receiving, via the excitation port, an excitation signal having the respective resonant frequency.

According to at least one aspect of the disclosure, a method of operating a slot antenna is provided and includes providing, by an excitation port, a first excitation signal to a plurality of slots and a base portion of the slot antenna, outputting, by a first slot of the plurality of slots responsive to receiving the first excitation signal, electromagnetic radiation, providing, by the excitation port, a second excitation signal to the plurality of slots and the base portion of the slot antenna, and outputting, by a second slot of the plurality of slots responsive to receiving the second excitation signal, electromagnetic radiation.

In some examples, the method includes providing, by the excitation port, a third excitation signal to the plurality of slots and the base portion of the slot antenna, and outputting, by the base portion responsive to receiving the third excitation signal, electromagnetic radiation. In various examples, the method includes providing the first excitation and the second excitation signal to the plurality of slots and the base portion via a conductive rod coupled to the plurality of slots. In at least one example, the electromagnetic radiation output by the first slot responsive to receiving the first excitation signal is first electromagnetic radiation, the method further comprising providing, by the excitation port, a third excitation signal to the plurality of slots and the base portion of the slot antenna, and outputting, by the first slot responsive to receiving the third excitation signal, second electromagnetic radiation. In various examples, the first electromagnetic radiation output by the first slot has a resonant wavelength equal to a length of the first slot. In at least one example, the second electromagnetic radiation output by the first slot has a resonant wavelength equal to twice the length of the first slot.

According to at least one aspect of the disclosure, a wearable audio device is provided comprising an antenna including an excitation port, and a conductive medium including a plurality of slots, each slot of the plurality of slots being electrically coupled to the excitation port; and a base portion being electrically coupled to the excitation port.

In various examples, each slot of the plurality of slots and the base portion is configured to transmit electromagnetic radiation of a respective resonant frequency responsive to receiving, via the excitation port, an excitation signal having the respective resonant frequency.

BRIEF DESCRIPTION OF THE DRAWINGS

Various aspects of at least one example are discussed below with reference to the accompanying figures, which are not intended to be drawn to scale. The figures are included to provide an illustration and a further understanding of the various aspects and examples, and are incorporated in and constitute a part of this specification, but are not intended as a definition of the limits of any particular example. The drawings, together with the remainder of the specification, serve to explain principles and operations of the described and claimed aspects and examples. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other examples and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, components, elements, or acts of the systems and methods herein referred to in the singular may also embrace examples including a plurality, and any references in plural to any example, component, element or act herein may also embrace examples including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

A headphone or earphone may refer to a device that typically fits around, on, in, or near an ear and that radiates acoustic energy into or towards the ear canal. Headphones and earphones are sometimes referred to as earpieces, headsets, earbuds, or sport headphones, and can be wired or wireless. Certain wireless headphones play audio to a user based on information received from an audio source. An audio source may include a computing device (for example, a laptop computer, desktop computer, tablet, smartphone, or other electronic device) configured to communicate wireless signals encoding audio information to the wireless headphones. While headphones are described in various examples within this document, the technology described in this document is also applicable to other wearable audio devices. The term "wearable audio device," as used in this document, is intended to mean a device that fits around, on, in, or near an ear (including open-ear audio devices worn on the head or shoulders of a user) and that radiates acoustic energy into or towards the ear. Wearable audio devices include but are not limited to headphones, earphones, earpieces, headsets, earbuds, sport headphones, and audio eyeglasses, and can be wired or wireless. In some examples, a wearable audio device may be an open-ear device that includes an acoustic driver to radiate acoustic energy towards the ear while leaving the ear open to its environment and surroundings.

A headphone may include an electro-acoustic transducer driver to transduce audio signals into acoustic energy. The acoustic driver may be housed in an earcup, earbud, or other housing. Some of the figures and descriptions following show a single headphone device or component, such as an antenna. A headphone may be a single stand-alone unit or one of a pair of headphones (each including at least one acoustic driver), one for each ear. A headphone may be connected mechanically and/or electrically to another headphone, for example by a headband and/or by leads that conduct audio signals to an acoustic driver in the headphone. A headphone may include components for wirelessly receiving audio signals or other wireless signals. A headphone may include components of an active noise reduction (ANR) system. Headphones may also include other components, such as microphones, accelerometers, gyroscopes, infrared sensors, compasses, GPS components, and so forth. A headphone may also be an open-ear device that includes an electro-acoustic transducer to radiate acoustic energy towards the ear canal while leaving the ear open to its environment and surroundings.

Figure 1:
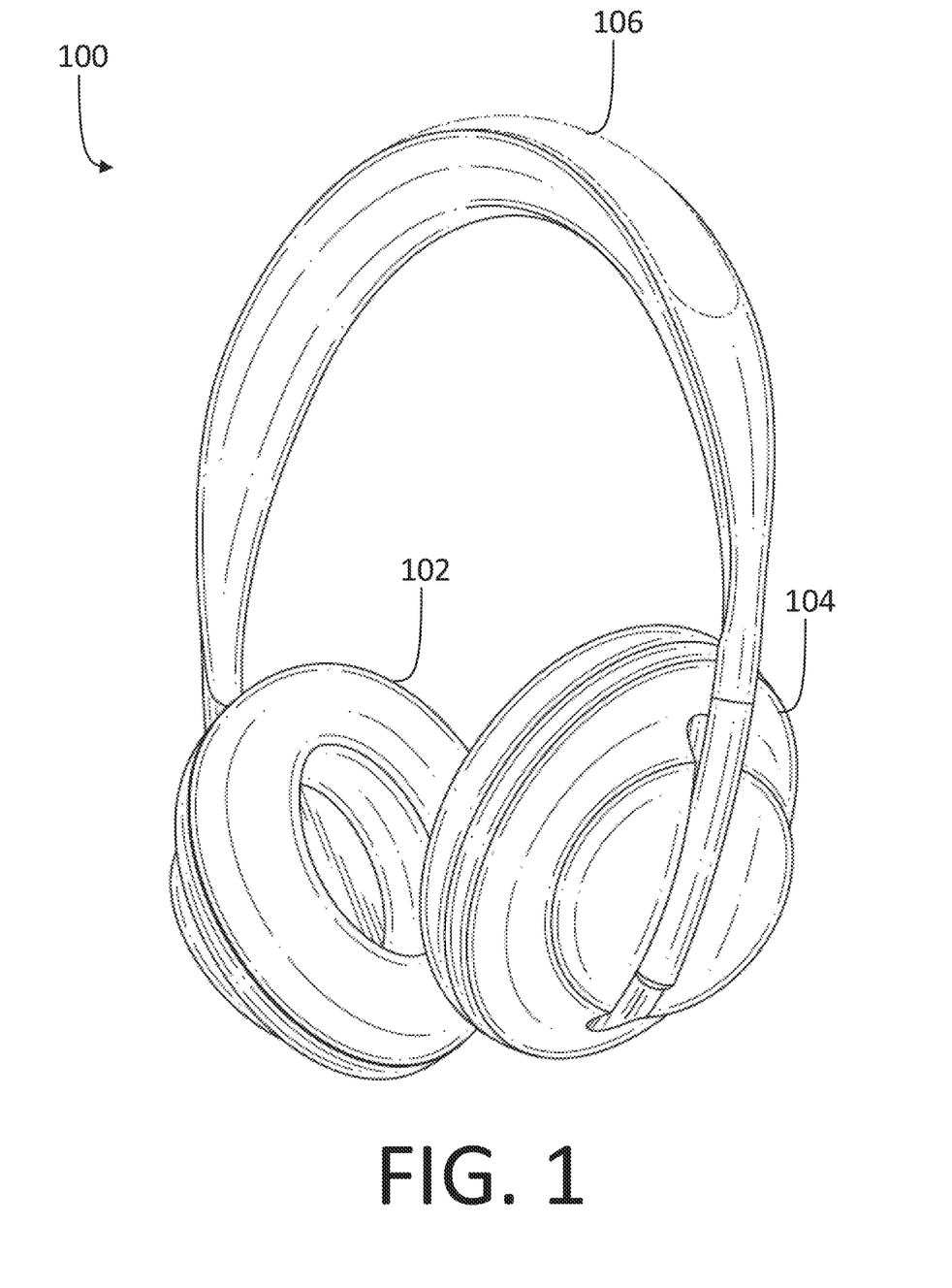
FIG. 1 illustrates a perspective view of headphones according to an example.

Example headphones will be described. FIG. 1 illustrates a perspective view of headphones 100 according to an example. The headphones 100 include a first housing 102, a second housing 104, and a connector 106. In one example, the first housing 102 may be configured to be placed over one of a user's ears, and the second housing 104 may be configured to be placed over another of the user's ears. The first housing 102 and the second housing 104 may each respectively include an acoustic driver configured to transmit acoustic energy to the user. The connector 106 may provide an electrical and/or mechanical connection between the first housing 102 and the second housing 104 and facilitate coupling of the headphones 100 to the user's ears and/or head.

Figure 2:
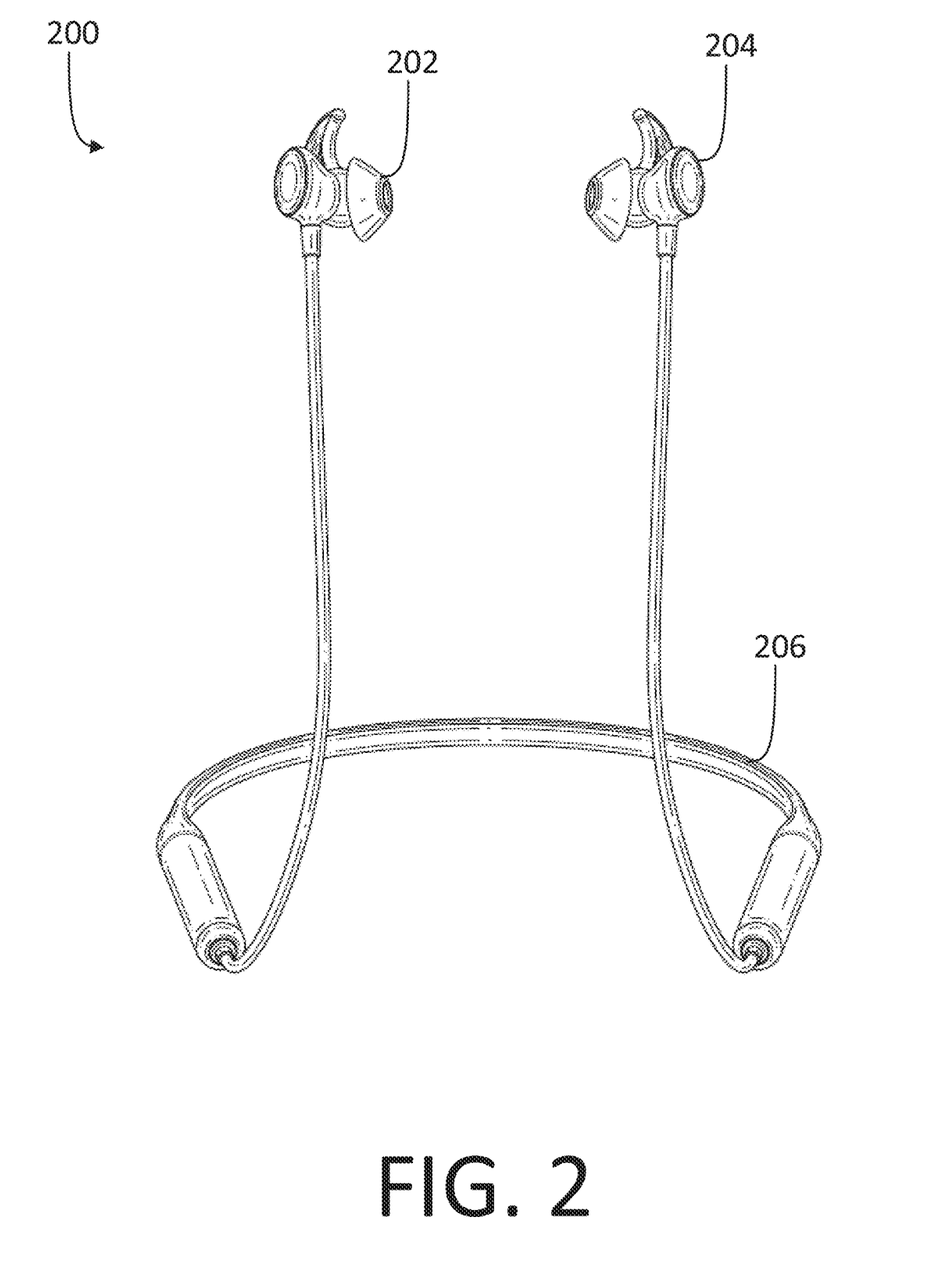
FIG. 2 illustrates a perspective view of headphones according to another example.

FIG. 2 illustrates a perspective view of headphones 200 according to another example. The headphones 200 include a first housing 202, a second housing 204, and a connector 206. In one example, the first housing 202 may be configured to be inserted into one of a user's ear canals or pinne, and the second housing 104 may be configured to be inserted into another of the user's ear canals or pinne. The first housing 202 and the second housing 204 may each respectively include an acoustic driver configured to provide acoustic energy to the user. The connector 206 may provide an electrical and/or mechanical connection between the first housing 202 and the second housing 204.

Figure 3A:
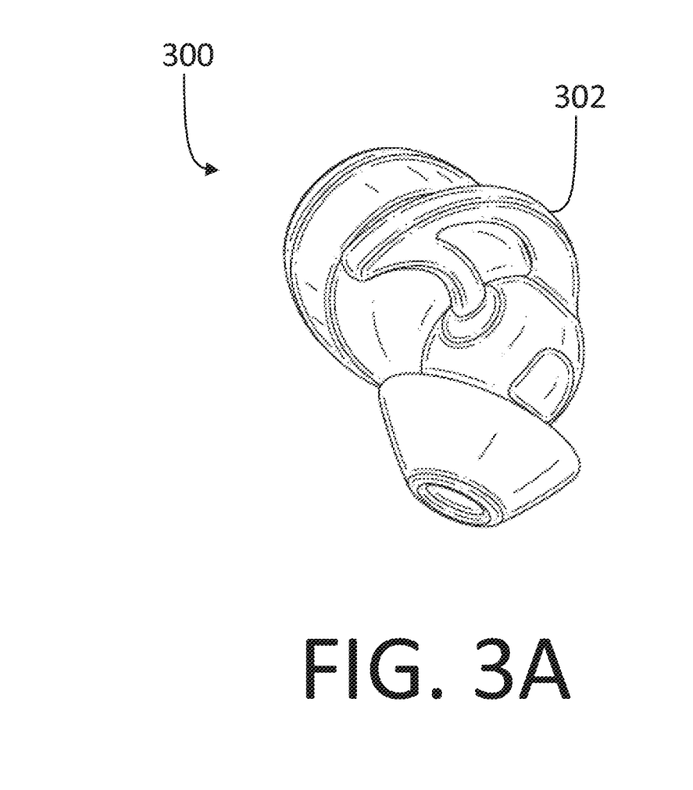
FIG. 3A illustrates a first perspective view of an earpiece according to an example.
Figure 3B:
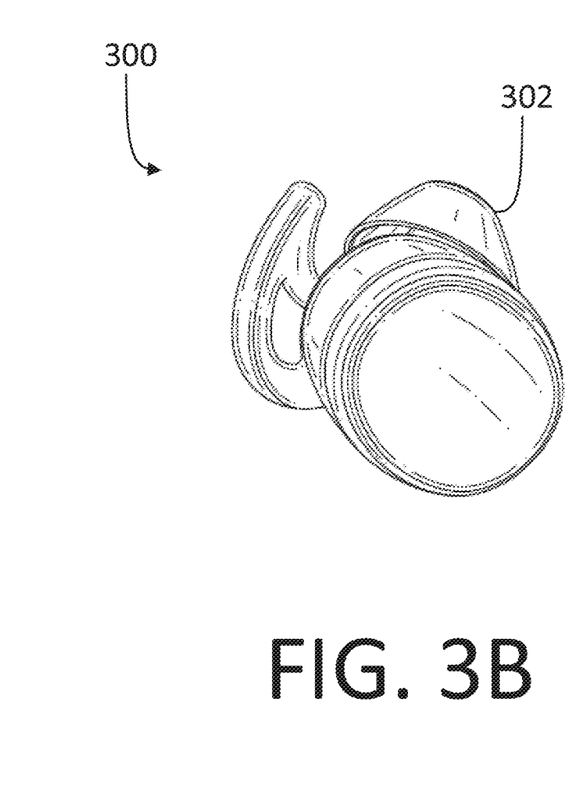
FIG. 3B illustrates a second perspective view of an earpiece according to an example.

FIG. 3A illustrates a perspective view of an earpiece 300 according to another example. FIG. 3B illustrates another perspective view of the earpiece 300 according to an example. The earpiece 300 includes a housing 302. In one example, the housing 302 may be configured to be inserted into one of a user's ear canals or pinne. The housing 302 may include an acoustic driver configured to provide acoustic energy to the user. The earpiece 300 may be implemented in conjunction with another, similar, headphone configured to be inserted into another of the user's ear canals or pinne. In some examples, the earpiece 300 and the similar headphone may communicate wirelessly with one another.

As discussed above, headphones may include components for wirelessly receiving audio signals. Components for wirelessly receiving audio signals may include one or more antennas. Antennas can convert electromagnetic waves propagating through space into electrical currents, and can convert electrical currents into electromagnetic waves propagated into space. Certain antenna properties, such as an antenna resonant frequency, radiation behavior (for example, a radiation pattern), polarization, and efficiency may be affected by a form factor or configuration of the antenna.

Figure 4A:
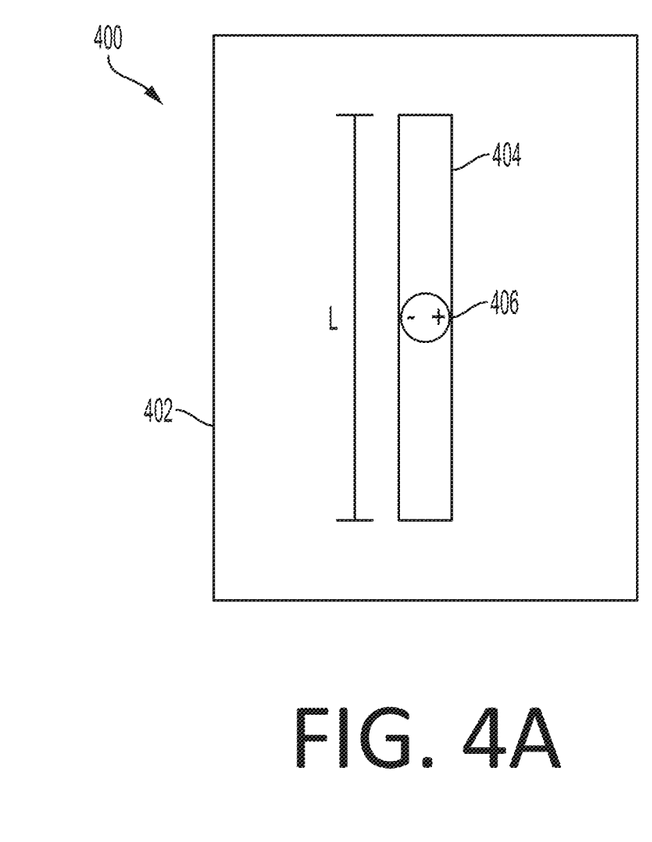
FIG. 4A illustrates a schematic diagram of a slot antenna according to an example.
Figure 4B:
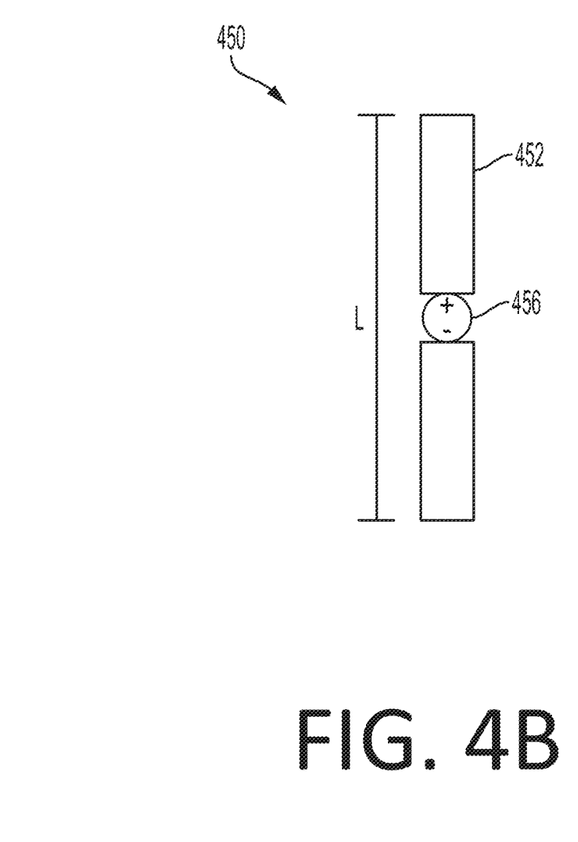
FIG. 4B illustrates a schematic diagram of a dipole antenna according to an example.

Antennas may be implemented by any of several configurations. For example, certain antennas disclosed herein may be configured as slot antennas. A slot antenna includes a conductive material in which a slot is cut or otherwise removed. An electric potential applied across the slot enables the slot antenna to radiate an electromagnetic field, and vice-versa. Pursuant to the duality principle, a slot dipole antenna (also referred to herein as a "slot antenna") is functionally similar to a dipole antenna in which the conductive medium of the slot antenna is replaced by air (or another medium) and the space occupying the slot is replaced by the conductive medium. FIGS. 4A and 4B illustrate the duality principle in greater detail.

FIG. 4A illustrates a schematic diagram of a slot antenna 400. FIG. 4B illustrates a schematic diagram of a dipole antenna 450. The slot antenna 400 includes a conductive medium 402 and a slot 404 cut, or otherwise removed, from the conductive medium 402. The slot 404 has a length L. The dipole antenna 450 includes a conductive medium 452 having a length L. The slot antenna 400 is the dual of the dipole antenna 450. That is, replacing the slot 404 with a material of which the conductive medium 402 is comprised and removing the conductive medium 402 yields the dipole antenna 450.

As understood by one of ordinary skill in the art, the dipole antenna 450 may transmit and/or receive electromagnetic radiation. For example, the dipole antenna 450 may transmit electromagnetic radiation responsive to receiving an excitation signal from a voltage source 456. Similarly, the slot antenna 400 may transmit and/or receive electromagnetic radiation. For example, the slot antenna 400 may transmit electromagnetic radiation responsive to receiving an excitation signal from a voltage source 406.

A length of the conductive medium 452 may, at least in part, dictate a resonant frequency of electromagnetic radiation output by the dipole antenna 450 when an excitation signal is applied across the conductive medium 452 by the voltage source 456. Similarly, a length of the slot 404 may, at least in part, dictate a resonant frequency of electromagnetic radiation output by the slot antenna 400 when an excitation signal is applied across the slot 404. The radiation patterns of the antennas 400, 450 may be similar, albeit having different polarizations. For example, where the slot antenna 400 radiates electromagnetic radiation having a horizontal polarization, the dipole antenna 450 radiates electromagnetic radiation having a vertical polarization. In light of the foregoing, it is to be appreciated that slot antennas, such as the slot antenna 400, may be configured to operate in a functionally similar manner (for example, by resonating at a similar frequency) as some known dipole antennas in a dual configuration, such as the dipole antenna 450.

Certain examples of the disclosure provide multi-band slot antennas excited by a single excitation port. Slot antennas disclosed herein may offer various advantages relative to functionally similar dipole antennas. For example, one benefit of slot antennas disclosed herein includes increased efficiency. Slot antennas may exhibit higher efficiencies than functionally similar dipole antennas. Slot antennas' higher efficiencies may be achieved, in part, due to lower current densities as compared to functionally similar dipole antennas, at least because a current-conducting portion of a slot antenna's conductive medium may have a larger volume than a current-conducting portion of a similar dipole antenna's conductive medium.

Another benefit of disclosed slot antennas includes the ability to transmit and receive electromagnetic radiation of various frequencies by adding multiple slots to a single conductive medium. Each slot of a slot antenna is capable of transmitting and receiving electromagnetic radiation of at least one frequency that is dictated by a length of the respective slot. That is, a length of a slot in a slot antenna dictates at least one resonant frequency of the slot. Accordingly, a single antenna can transmit and receive electromagnetic radiation of a number of frequencies dictated by a corresponding number of slots in the antenna.

Figure 11:
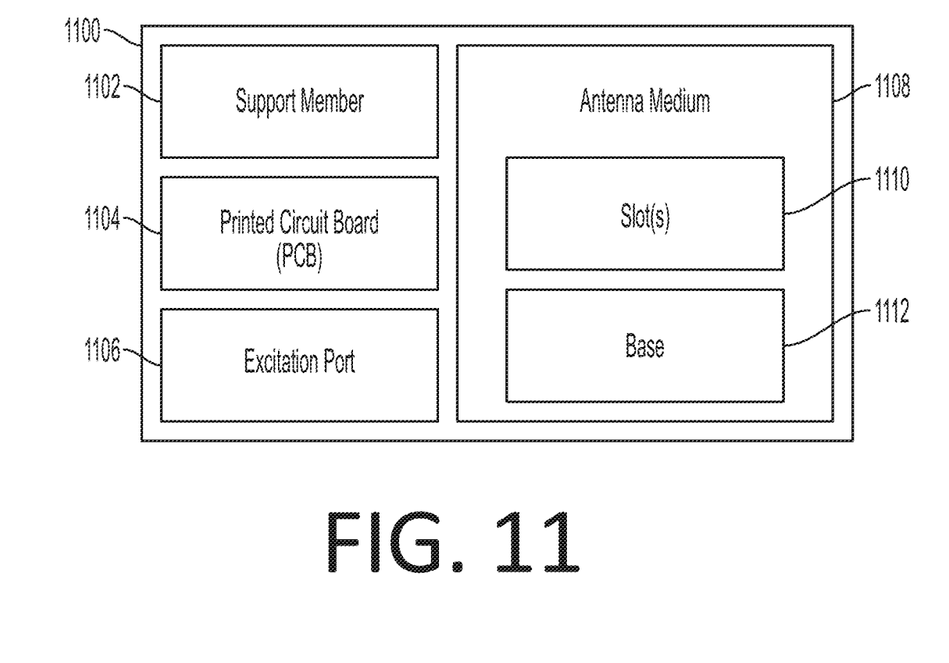
FIG. 11 illustrates a block diagram of a slot antenna according to an example.

FIG. 11 illustrates a block diagram of a slot antenna 1100 according to certain examples of the disclosure. The slot antenna 1100 may be implemented in connection with any of various devices including, for example, headphones or other wearable audio devices. For example, the slot antenna 1100 may be implemented in connection with any of the devices 100-300. The slot antenna 1100 includes a support member 1102, a printed circuit board (PCB) 1104, an excitation port 1106, and an antenna medium 1108. The antenna medium 1108 includes one or more slots 1110 and a base 1112, which includes a circumference edge of the antenna medium 1108.

As discussed in greater detail below, the slot antenna 1100 is generally configured to transmit and receive electromagnetic radiation via the slots 1110 and/or the base 1112 of the antenna medium 1108, which is dressed over the support member 1102. An excitation signal may be provided to the slots 1110 and to the base 1112 by the PCB 1104 via the excitation port 1106. Each of the slots 1110 and the base 1112 may be configured to transmit and receive electromagnetic radiation of one or more desired frequencies. For example, a respective length of each of the slots 1110 and the base 1112 may be selected to correspond to a respective desired resonant frequency. Thus, examples of the slot antenna 1100 may transmit and receive electromagnetic radiation of various desired frequencies.

The support member 1102 is generally configured to provide structural support for components of the slot antenna 1100, and facilitate connections, including electrical connections, between components of the slot antenna 1100. For example, the support member 1102 may provide a structure upon which to dress, affix, and/or form the antenna medium 1108. In such examples, a form factor of the support member 1102 may dictate or impact a form factor of the antenna medium 1108. The support member 1102 may also be affixed or otherwise connected to the PCB 1104 to facilitate a connection between the antenna medium 1108, the PCB 1104, and the excitation port 1106.

In some examples, the support member 1102 be formed of a non-conductive medium. For example, the support member 1102 may be formed of any of various plastics, or another non-conductive medium. The support member 1102 may be configured to have a non-planar form factor, such as a non-planar enclosure. For example, the support member 1102 may be formed in a dome shape or other enclosure. In other examples, the support member 1102 may be configured to form another shape, such as an ovular dome form factor. The support member 1102 may have a symmetrical form factor in some examples, and may have an asymmetrical form factor in other examples. For purposes of illustration only, some examples of the support member 1102 are provided herein having a symmetrical dome-shaped form factor. In some of these examples, the support member 1102 has a footprint radius of approximately 9 mm.

The support member 1102 and antenna medium 1108 may be coupled to a top surface of the PCB 1104. The PCB 1104 is generally configured to transmit and receive signals to and from the antenna medium 1108 via the excitation port 1106. For example, the PCB 1104 may transmit a current and/or voltage signal to the antenna medium 1108 such that the antenna medium 1108 may transduce (for example, via the slots 1110 and/or base 1112) the signals into output electromagnetic radiation. Similarly, the antenna medium 1108 may transduce (for example, via the slots 1110 and/or the base 1112) input electromagnetic radiation into one or more current and/or voltage signals, and provide the signals to the PCB 1104 via the excitation port 1106. A bottom surface of the PCB 1104 may be plated with a conductive medium, such as a solid copper plane, to provide a ground plane for the slot antenna 1100.

The excitation port 1106 is generally configured to transmit and receive excitation signals between the PCB 1104 and the conducive medium 1108. More particularly, the excitation port 1106 may be configured to transmit and receive excitation signals between the PCB 1104 and the slots 1110 and/or the base 1112. Excitation signals transmitted and received by the PCB 1104 may have a frequency that is approximately equal to, or close to, a resonant frequency of at least one of the slots 1110 and the base 1112. In at least one example, the single excitation port 1106 transmits and receives excitation signals for all of the slots 1110 and the base 1112, rather than each of the slots 1110 and the base 1112 having a dedicated excitation port. In such examples, an amount of space occupied by the slot antenna 1100 is advantageously reduced at least because a size of the PCB 1104 may be reduced.

For example, the excitation port 1106 may be electrically coupled to the PCB 1104 and each of the slots 1110 and the base 1112 via a single conductive rod. The conductive rod may be configured to be electrically coupled to the PCB 1104, the excitation port 1106, each of the slots 1110, and the base 1112, such that the excitation port 1106 may transmit and receive electrical signals between the PCB 1104 and each of the slots 1110 and the base 1112.

The antenna medium 1108 provides a medium from which to form the slots 1110 and the base 1112. For example, the antenna medium 1108 may be dressed, affixed, and/or formed on the support member 1102. In examples in which the antenna medium 1108 is dressed over the support member 1102, the antenna medium 1108 is formed in a shape dictated by a form factor of the support member 1102. For example, if the support member 1102 has a dome-shaped form factor, the antenna medium 1108 may similarly have a dome-shaped form factor when dressed over the support member 1102.

In various examples, the antenna medium 1108 is formed of a conductive medium. For example, the antenna medium 1108 may be formed at least partially of copper, or another non-conductive medium. The antenna medium may be electrically coupled to the PCB 1104 around the base 1112 of the antenna medium 1108, where the base 1112 has a structure corresponding to a footprint of the slot antenna 1100. As discussed in greater detail below, the base 1112 of the antenna medium 1108 may be configured to transmit and/or receive electromagnetic radiation.

The one or more slots 1110, which may include any number of slots, are configured to transmit and receive electromagnetic radiation in addition to the base 1112. Physical properties of the one or more slots 1110 and the base 1112 may affect a resonant frequency of electromagnetic radiation transmitted and received by the one or more slots 1110 and the base 1112. For example, a respective length of the one or more slots 1110 and the base 1112 may dictate a respective resonant frequency of each of the slots 1110 and the base 1112.

Each respective length may be equal or close to the desired resonant wavelength in one example. In another example, the length may be equal to a fraction of the desired resonant wavelength, such as being equal or close to a half- or quarter-wavelength of the desired resonant wavelength. By way of example, if an exemplary desired resonant wavelength of the slot antenna 1100 is approximately 5.76 cm (corresponding to a resonant frequency of approximately 5.2 GHz), then one of the slots 1110 may be configured to have a length of approximately 5.76 cm (a full resonant wavelength), approximately 2.88 cm (a half resonant wavelength), or approximately 1.44 cm (a quarter resonant wavelength).

Accordingly, in some examples, a number and length of each of the slots 1110 may be selected based on which resonant frequency or frequencies that the slot antenna 1100 is desired to have. For example, if it is desirable for the slot antenna 1100 to transmit and receive electromagnetic radiation of a first frequency and a second frequency, the slots 1110 and the base 1112 may be configured to resonate at the first frequency and the second frequency. In a first implementation, the one or more slots 1110 may include a single slot configured to resonate at the first frequency, and the base 1112 may be configured to resonate at the second frequency. In a second implementation, the one or more slots 1110 may include a single slot configured to resonate at both the first frequency and the second frequency. In a third implementation, the one or more slots 1110 may include a first slot configured to resonate at the first frequency, and a second slot configured to resonate at the second frequency. In other implementations, other configurations may be implemented to enable the slot antenna 1100 to resonate at the first and second frequencies.

Figure 5:
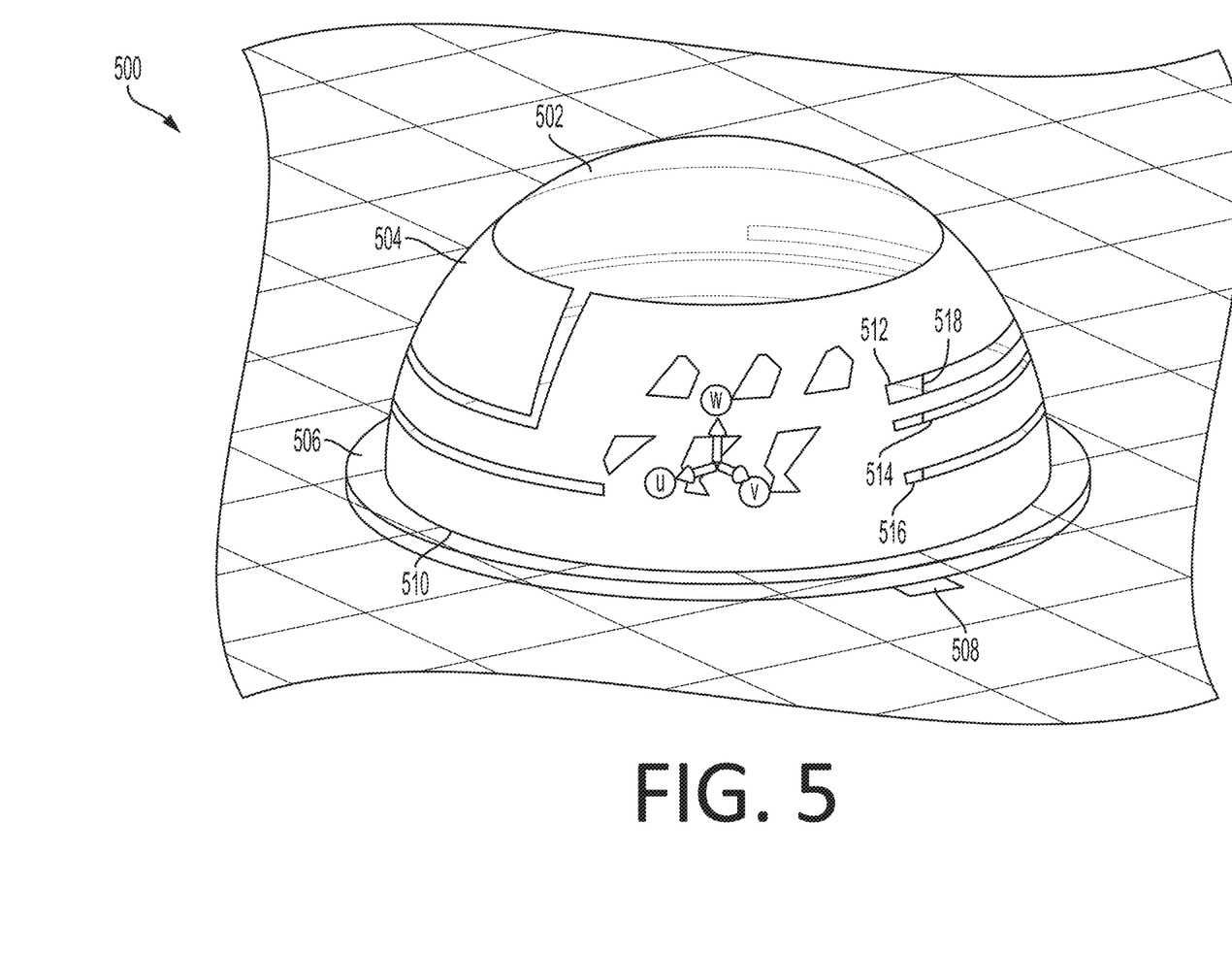
FIG. 5 illustrates a perspective view of a slot antenna according to an example.

One example of the slot antenna 1100 will now be described with respect to FIG. 5, which illustrates a perspective view of a slot antenna 500 according to one example of the disclosure. The slot antenna 500 may be implemented in connection with any of various devices including, for example, headphones or other wearable audio devices. The slot antenna 500 includes a support member 502, an antenna medium 504, a PCB 506, and an excitation port 508. The support member 502 is illustrated in phantom for purposes of explanation.

The support member 502, which may be an example of the support member 1102, provides support for components of the slot antenna 500 and facilitates connections between components of the slot antenna 500. For example, the support member 502 may provide a structure upon which to dress, affix, and/or form the antenna medium 504. The support member 502 may also be affixed or otherwise connected to the PCB 506 to facilitate a connection between the antenna medium 504 and the PCB 506. In one example, the support member 502 is comprised of a non-conductive plastic material.

The antenna medium 504 provides a medium from which to form slots of the slot antenna 500. For example, the antenna medium 504 may be dressed, affixed, and/or formed on the support member 502. A form factor of the antenna medium 504 may thus be impacted by a form factor of the support member 502. In one example, the support member 502 and the antenna medium 504 have a form factor resembling a symmetrical dome. However, in other examples, the support member 502 and the antenna medium 504 may be asymmetrical, and may or may not have a dome-shaped form factor.

The antenna medium 504 may be electrically coupled to the PCB 506 around a base 510 of the antenna medium 504. The base 510 may be capable of transmitting and receiving electromagnetic radiation. In addition to the slot antenna 500 being able to transmit and/or receive electromagnetic radiation via the base 510, the antenna medium 504 may include various slots configured to transmit and/or receive electromagnetic radiation. In an illustrated example, the antenna medium 504 includes a first slot 512, a second slot 514, and a third slot 516.

The slots 512-516 may be electrically coupled to the PCB 506 via the excitation port 508. For example, the excitation port 508 may include a conductive rod 518 configured to be electrically coupled to the excitation port 508, the base 510, and the slots 512-516, such that the excitation port 508 may transmit and receive electrical signals capable of being transduced to or from electromagnetic radiation by the base 510 and/or the slots 512-516.

As discussed above, a length of a slot in a slot antenna may determine a resonant frequency of the slot antenna. Each of the slots 512-516 may be configured to have a length corresponding to a desired resonant frequency. That is, in some examples, a number and length of slots implemented in connection with the antenna medium 504 may be selected to enable the slot antenna 500 to transmit and/or receive electromagnetic radiation of one or more desired frequencies.

In one example provided herein, the slot antenna 500 is configured to transmit and/or receive electromagnetic radiation having at least five frequencies including 1.57 GHz (a global positioning satellite [GPS] frequency), 2.4 GHz (a 2.4 industrial, scientific and medical [ISM] frequency), 5.2 GHz (a Wi-Fi™ frequency), 5.8 GHz (a second Wi-Fi™ frequency), and 3.7 GHz (a terrestrial broadband frequency). As discussed in greater detail below, the five frequencies may be implemented at least in part based on a configuration of the base 510 and the slots 512-516. Operation of each of the slots 512-516 and the base 510 is discussed in turn below.

A configuration of the base 510 will now be described. As discussed above, the base 510 includes a portion of the antenna medium 504 that is coupled electrically and/or structurally with the PCB 506. Where the antenna medium 504 is implemented as a hemispherical dome, for example, the base 510 may be approximately circular around a perimeter of the antenna medium 504 where the antenna medium 504 interfaces the PCB 506. In alternate examples in which the antenna medium 504 is implemented as a non-spherical dome, for example, the base 510 may be approximately elliptical around a perimeter of the antenna medium 504.

As discussed above, a length of the base 510 may, at least in part, determine a resonant frequency of the base 510. In one example, a length of the base 510 is approximately equal to a resonant wavelength of a desired resonant frequency. For example, the length of the base 510 may correspond to a resonant frequency of approximately 3.7 GHz.

In this example, the slot antenna 500 may transmit, via the base 510, electromagnetic radiation at a frequency of approximately 3.7 GHz responsive to the base 510 receiving an excitation signal from the excitation port 508. Similarly, the slot antenna 500 may receive electromagnetic radiation at a frequency of approximately 3.7 GHz, and the base 510 transduce the electromagnetic radiation into a current signal that is provided to the excitation port 508. For example, the base 510 may be electrically coupled to the excitation port 508 via the conductive rod 518.

Figure 6:
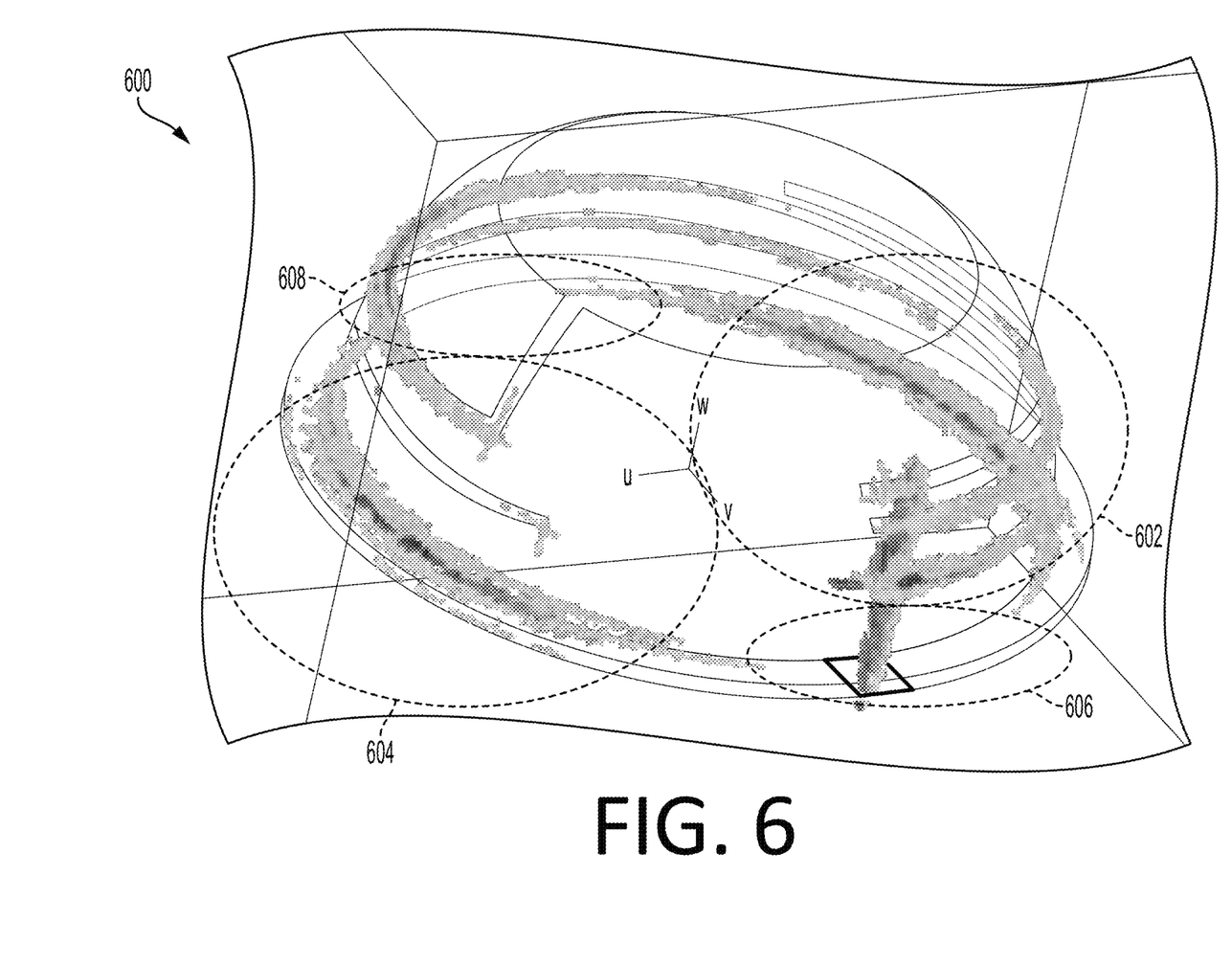
FIG. 6 illustrates a perspective view of a first current density plot of the slot antenna of FIG. 5 according to an example.

FIG. 6 illustrates a perspective view of a three-dimensional plot 600 of the slot antenna 500 transmitting or receiving electromagnetic radiation of approximately 3.7 GHz. The slot antenna 500 is illustrated partially in phantom for purposes of illustration. Darker regions of the three-dimensional plot 600 are indicative of regions of greater amounts of current, and lighter regions of the three-dimensional plot 600 are indicative of regions of lesser amounts of current.

For example, a first region 602 and a second region 604 of the plot 600, falling along the base 510, indicate regions of the greatest amounts of current. The first region 602 and the second region 604 may indicate a crest and trough of a resonant wavelength of electromagnetic radiation transmitted or received by the base 510. By contrast, a third region 606 and a fourth region 608, falling along the base 510, indicate regions of lesser amounts of current. For example, the third region 606 and the fourth region 608 may indicate roughly zero-point crossings of the resonant wavelength of electromagnetic radiation transmitted or received by the base 510.

The slot antenna 500 may exhibit a degree of cross-coupling for certain frequencies of electromagnetic radiation. For example, as illustrated by the plot 600, current may flow in portions of the slot antenna 500 corresponding to the slots 512-516. Although some cross-coupling may be present, however, the base 510 may exhibit a strongest resonance at 3.7 GHz, or another frequency to which the base 510 is tuned, and may dominate any current produced by the slots 512-516.

A configuration of the slot 512 will now be described. As discussed above, the slot 512 may be formed in the antenna medium 504, and may have dimensions corresponding to a desired resonant frequency. In one example, a length of the slot 512 is approximately equal to one-half of a resonant wavelength of a desired resonant frequency. For example, the length of the slot 512 may have a length that is one-half of a resonant wavelength corresponding to a resonant frequency of approximately 5.8 GHz.

In this example, the slot antenna 500 may transmit, via the slot 512, electromagnetic radiation at a frequency of approximately 5.8 GHz responsive to the slot 512 receiving an excitation signal from the excitation port 508. Similarly, the slot antenna 500 may receive electromagnetic radiation at a frequency of approximately 5.8 GHz, and the slot 512 may transduce the electromagnetic radiation into a current signal that is provided to the excitation port 508. For example, the slot 512 may be electrically coupled to the excitation port 508 via the conductive rod 518.

Figure 7:
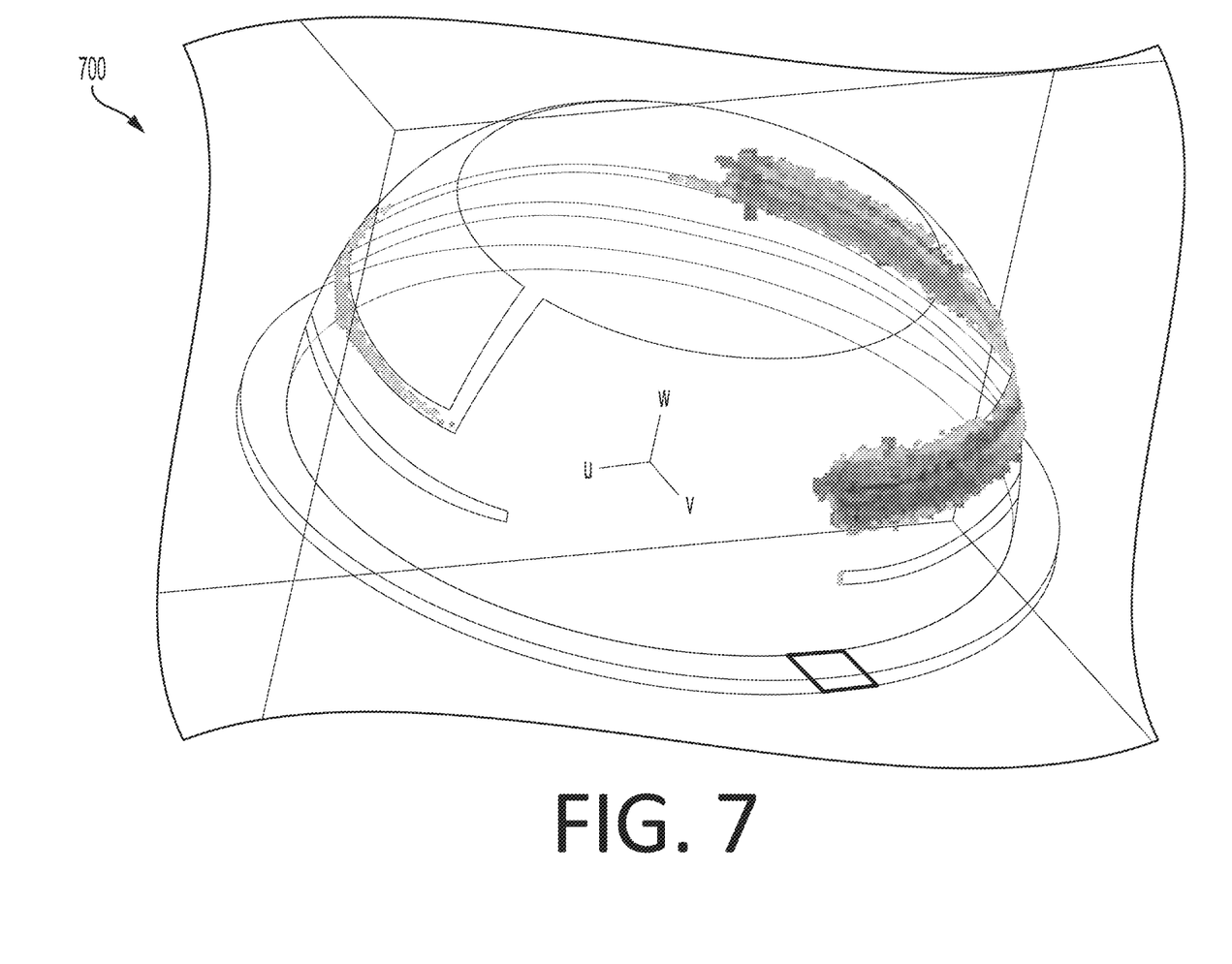
FIG. 7 illustrates a perspective view of a second current density plot of the slot antenna of FIG. 5 according to an example.

FIG. 7 illustrates a perspective view of a three-dimensional plot 700 of the slot antenna 500 transmitting or receiving electromagnetic radiation of approximately 5.8 GHz. The slot antenna 500 is illustrated partially in phantom for purposes of illustration. Similar to the plot 600, darker regions of the three-dimensional plot 700 are indicative of regions of greater amounts of current, and lighter regions of the three-dimensional plot 700 are indicative of regions of lesser amounts of current.

The slot antenna 500 may exhibit a degree of cross-coupling for certain frequencies of electromagnetic radiation. For example, as illustrated by the plot 700, current may flow in portions of the slot antenna 500 corresponding at least to the slot 514. Although some cross-coupling may be present, however, the slot 512 may exhibit a strongest resonance at 5.8 GHz, or another frequency to which the slot 512 is tuned, and dominate any current produced by the slot 514.

A configuration of the slot 514 will now be described. As discussed above, the slot 514 may be formed in the antenna medium 504, and may have dimensions corresponding to a desired resonant frequency. In one example, a length of the slot 514 is approximately equal to one-fourth of a resonant wavelength of a desired resonant frequency. For example, the length of the slot 514 may have a length that is one-fourth of a resonant wavelength corresponding to a resonant frequency of approximately 1.57 GHz.

In this example, the slot antenna 500 may transmit, via the slot 514, electromagnetic radiation at a frequency of approximately 1.57 GHz responsive to the slot 514 receiving an excitation signal from the excitation port 508. Similarly, the slot antenna 500 may receive electromagnetic radiation at a frequency of approximately 1.57 GHz, and the slot 514 may transduce the electromagnetic radiation into a current signal that is provided to the excitation port 508. For example, the slot 514 may be electrically coupled to the excitation port 508 via the conductive rod 518.

Figure 8:
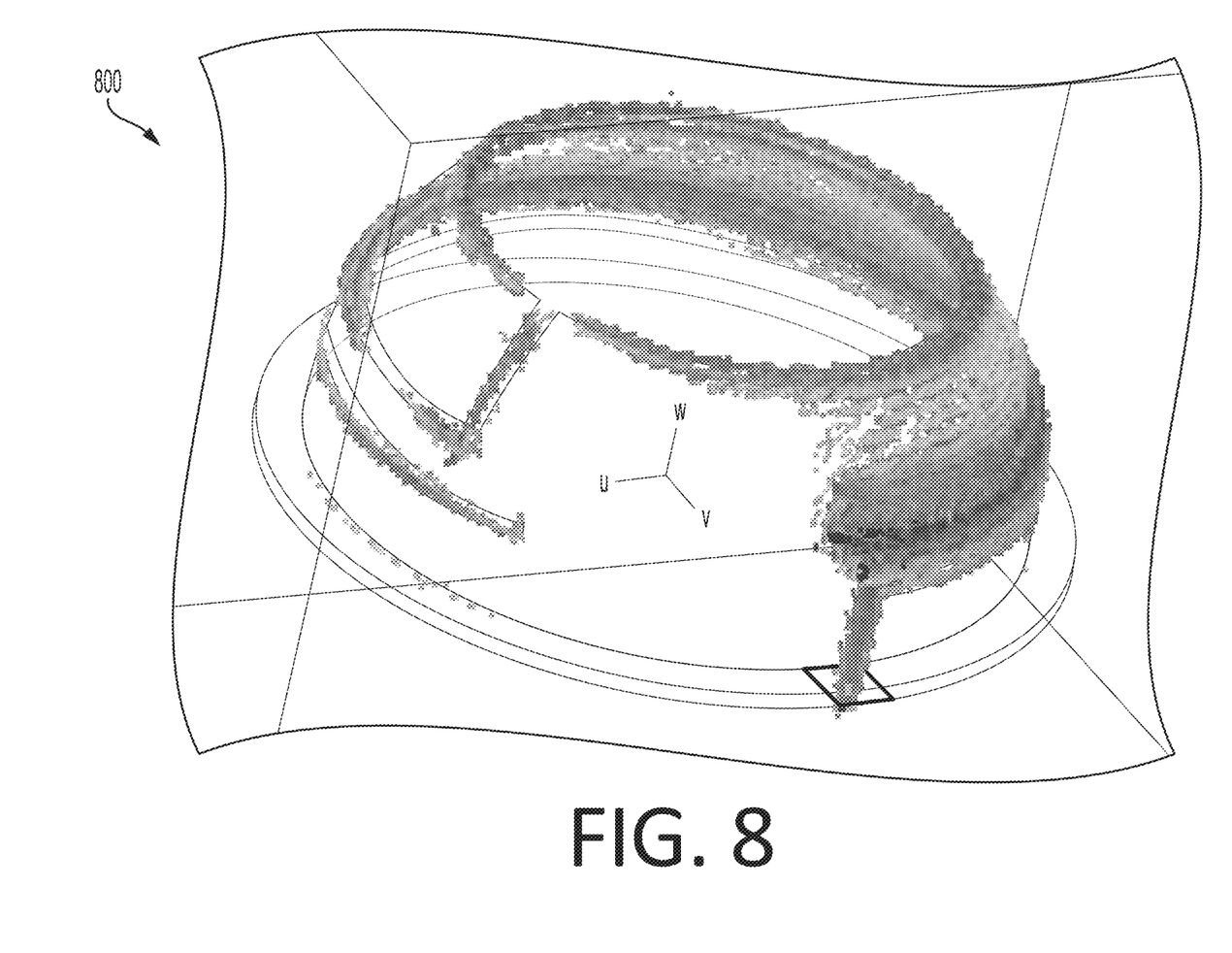
FIG. 8 illustrates a perspective view of a third current density plot of the slot antenna of FIG. 5 according to an example.

FIG. 8 illustrates a perspective view of a three-dimensional plot 800 of the slot antenna 500 transmitting or receiving electromagnetic radiation of approximately 1.57 GHz. The slot antenna 500 is illustrated partially in phantom for purposes of illustration. Similar to the plot 600, darker regions of the three-dimensional plot 800 are indicative of regions of greater amounts of current, and lighter regions of the three-dimensional plot 800 are indicative of regions of lesser amounts of current.

The slot antenna 500 may exhibit a degree of cross-coupling for certain frequencies of electromagnetic radiation. For example, as illustrated by the plot 800, current may flow in portions of the slot antenna 500 corresponding at least to the slots 512 and 516. Although some cross-coupling may be present, however, the slot 514 may exhibit a strongest resonance at 1.57 GHz, or another frequency to which the slot 514 is tuned, and dominate any current produced by the slots 512 and 516.

A configuration of the slot 516 will now be described. As discussed above, the slot 516 may be formed in the antenna medium 504, and may have dimensions corresponding to at least one desired resonant frequency. In one example, a length of the slot 516 is approximately equal to one-half of a resonant wavelength of a first desired resonant frequency, and is approximately equal to a resonant wavelength of a second desired resonant frequency. For example, the length of the slot 516 may have a length that is one-half of a resonant wavelength corresponding to a resonant frequency of approximately 2.4 GHz, and that is approximately equal to a resonant wavelength corresponding to a resonant frequency of approximately 5.2 GHz.

In this example, the slot antenna 500 may transmit, via the slot 516, electromagnetic radiation at a frequency of approximately 2.4 GHz responsive to the slot 516 receiving an excitation signal from the excitation port 508, and may transmit, via the slot 516, electromagnetic radiation at a frequency of approximately 5.2 GHz responsive to the slot 516 receiving an excitation signal from the excitation port 508. Similarly, the slot antenna 500 may receive electromagnetic radiation at a frequency of approximately 2.4 GHz and/or 5.2 GHz, and the slot 516 may transduce the electromagnetic radiation into a current signal that is provided to the excitation port 508. For example, the slot 516 may be electrically coupled to the excitation port 508 via the conductive rod 518.

Figure 9:
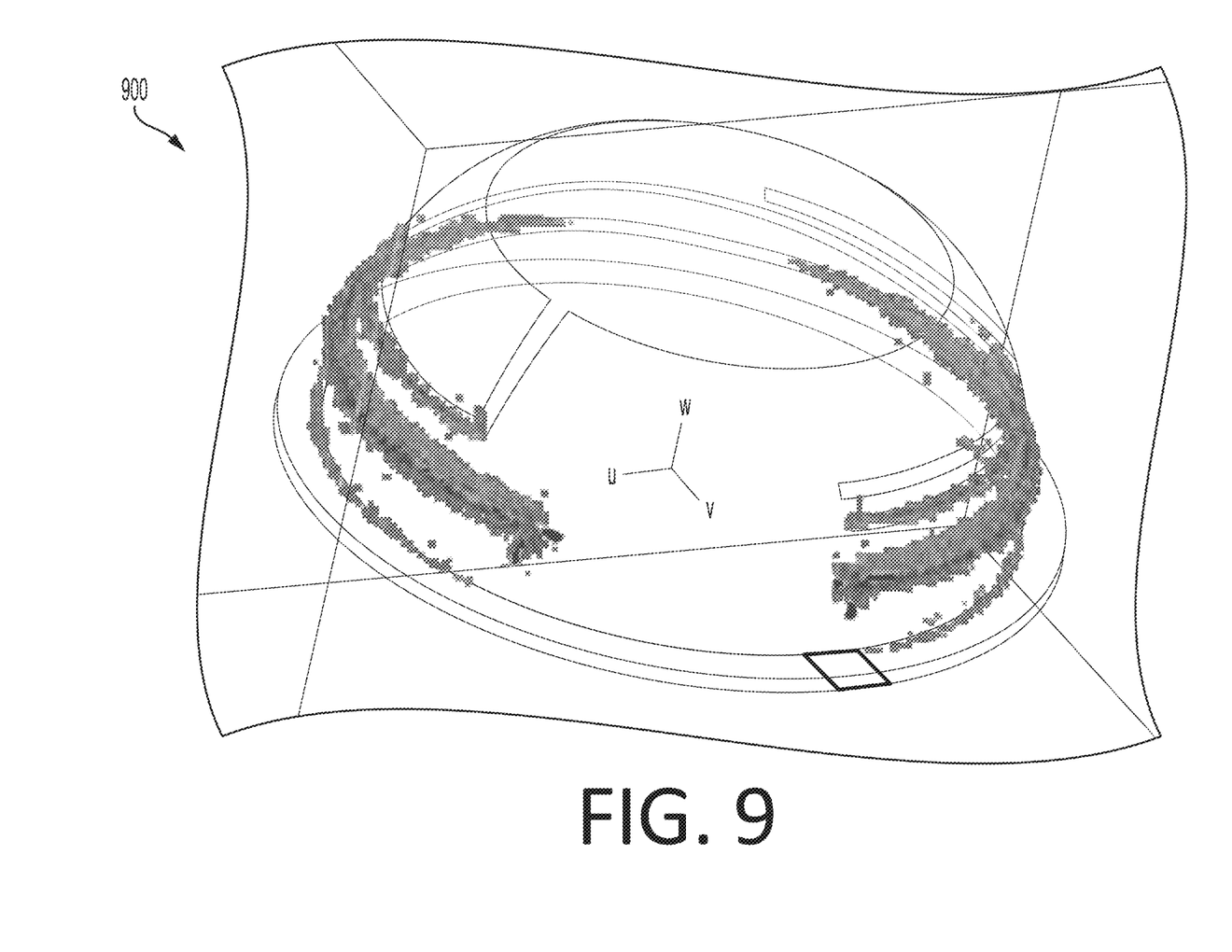
FIG. 9 illustrates a perspective view of a fourth current density plot of the slot antenna of FIG. 5 according to an example.

FIG. 9 illustrates a perspective view of a three-dimensional plot 900 of the slot antenna 500 transmitting or receiving electromagnetic radiation of approximately 2.4 GHz. The slot antenna 500 is illustrated partially in phantom for purposes of illustration. Similar to the plot 600, darker regions of the three-dimensional plot 900 are indicative of regions of greater amounts of current, and lighter regions of the three-dimensional plot 900 are indicative of regions of lesser amounts of current.

The slot antenna 500 may exhibit a degree of cross-coupling for certain frequencies of electromagnetic radiation. For example, as illustrated by the plot 900, current may flow in portions of the slot antenna 500 corresponding at least to the slots 512 and 514 and the base 510. Although some cross-coupling may be present, however, the slot 516 may exhibit a strongest resonance at 2.4 GHz, or another frequency to which the slot 516 is tuned, and dominate any current produced by the slots 512 and 514 and the base 510.

Figure 10:
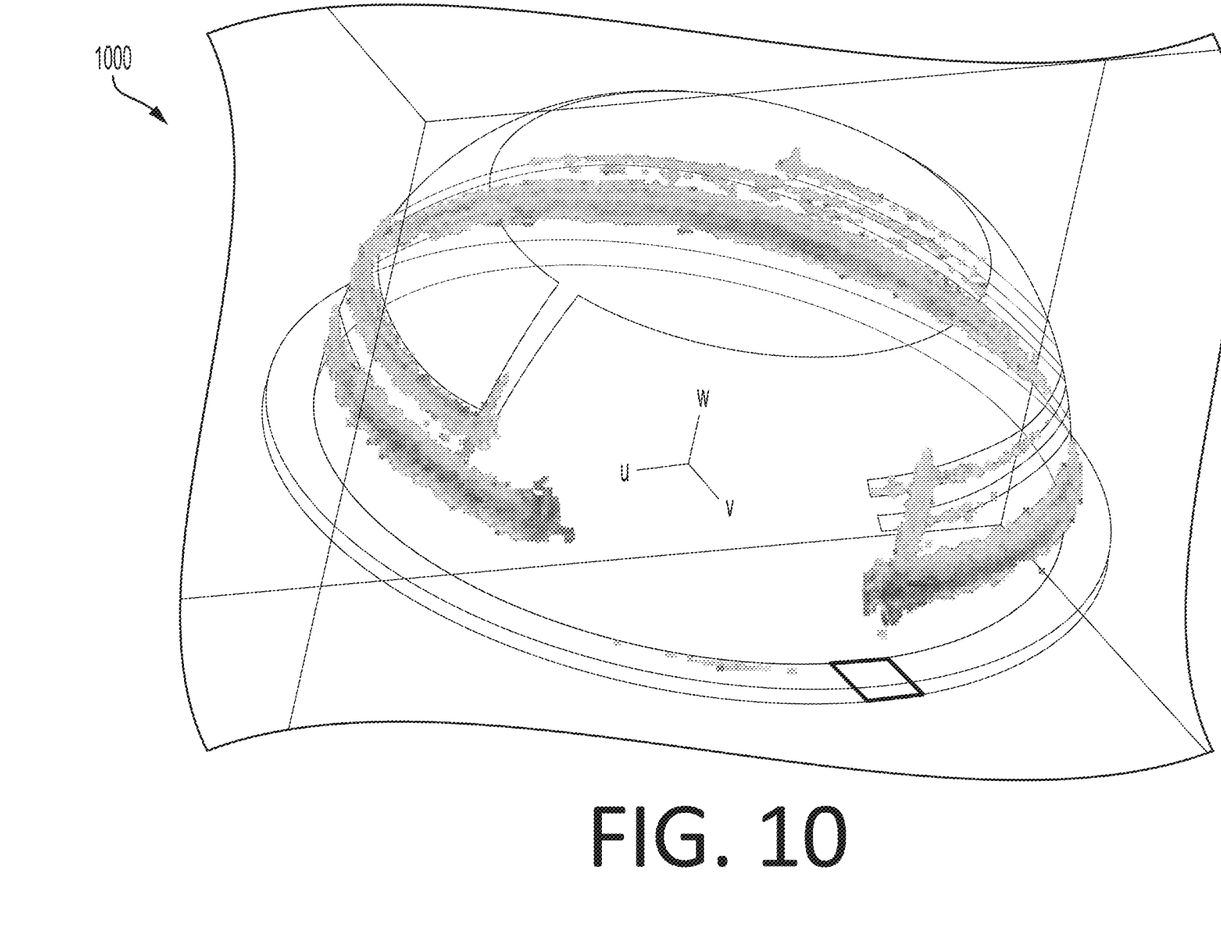
FIG. 10 illustrates a perspective view of a fifth current density plot of the slot antenna of FIG. 5 according to an example.

FIG. 10 illustrates a perspective view of a three-dimensional plot 1000 of the slot antenna 500 transmitting or receiving electromagnetic radiation of approximately 5.2 GHz. The slot antenna 500 is illustrated partially in phantom for purposes of illustration. Similar to the plot 600, darker regions of the three-dimensional plot 1000 are indicative of regions of greater amounts of current, and lighter regions of the three-dimensional plot 1000 are indicative of regions of lesser amounts of current.

The slot antenna 500 may exhibit a degree of cross-coupling for certain frequencies of electromagnetic radiation. For example, as illustrated by the plot 1000, current may flow in portions of the slot antenna 500 corresponding at least to the slots 512 and 514 and the base 510. Although some cross-coupling may be present, however, the slot 516 may exhibit a strongest resonance at 5.2 GHz, or another frequency to which the slot 516 is tuned, and dominate any current produced by the slots 512 and 514 and the base 510.

As discussed above, a respective length of each of the base 510 and the slots 512-516 may be approximately equal to a desired resonant wavelength. In other examples, the respective length of each of the base 510 and the slots 512-516 may be similar to a desired resonant wavelength, but may not be equal to the desired resonant wavelength. For example, a respective length of at least one of the base 510 and/or the slots 512-516 may differ from a resonant wavelength to which the base 510 and/or the slots 512-516 correspond by several centimeters, provided that the base 510 and/or the slots 512-516 are capable of effectively transmitting and/or receiving electromagnetic radiation of a desired resonant wavelength.

Each of the slots 512-516 may be configured to have a different orientation and/or position in the antenna medium 504 than those illustrated in connection with the slot antenna 500. For example, although each of the slots 512-516 is illustrated as being parallel to the PCB 506, in some examples one or more of the slots 512-516 may be at least partially perpendicular to the PCB 506.

An orientation and/or position of each of the slots 512-516 may be selected based on various design factors. For example, a design factor may include a desired polarity of electromagnetic radiation transmitted and/or received by each of the slots 512-516. Another design factor may include a desired distance from the human body, which may advantageously reduce capacitive loading on the slot antenna 500. Another design factor may include a desired number of slots, where an orientation and/or position of slots may vary to accommodate the inclusion of slots in addition to the slots 512-516. Another design factor may include a degree of cross-coupling, where slots having similar resonant frequencies may be positioned farther from one another to reduce cross-coupling effects. Yet another design factor may include desired resonant wavelengths, where an orientation and/or position of slots may vary to accommodate the inclusion of slots having a desired length.

Similarly, a number of slots may be selected based on various design factors including, for example, a number of desired resonant frequencies. A number of slots may be equal to or less than a number of desired resonant frequencies. For example, and as discussed above with respect to the slot 516, a single slot may be configured to transmit and/or receive electromagnetic radiation of multiple resonant frequencies. Although the slot 516 is described as corresponding to at least two resonant frequencies, in other examples, a single slot may transmit and/or receive electromagnetic radiation of at least three resonant frequencies. For example, a single slot may have a length corresponding to a first resonant wavelength, one-half wavelength of a second resonant wavelength, and one-fourth wavelength of a third resonant wavelength.

As discussed above, examples of the slot antenna 500 are illustrated as a symmetrical dome for purposes of illustration only. In other examples, the slot antenna 500 may be symmetrical or asymmetrical, and the slot antenna 500 may be formed having a shape other than a dome shape. In some examples, the slot antenna 500 may be planar. In other examples, the slot antenna 500 may be a non-planar enclosure, which may include any non-planar surface closed at an interface with the PCB 506. Furthermore, other examples of slot antennas may be formed having dimensions, including a length, height, width, and eccentricity, other than those provided in connection with the discussed examples.

Certain values of resonant frequencies are provided as examples only. Alternate examples may be configured to transmit and/or receive electromagnetic radiation of other frequencies not specifically identified herein, such as a 5.7 GHz signal, or another desired frequency.

Having thus described several aspects of at least one example, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An antenna comprising:
   an excitation port;
   a conductive medium including:
     a plurality of slots, each slot of the plurality of slots being electrically coupled to the excitation port; and
     a base portion being electrically coupled to the excitation port; and
   a printed circuit board (PCB) configured to transmit and/or receive, via the excitation port, at least one excitation signal to and/or from the plurality of slots and the base portion.

2. The antenna of claim 1, further comprising a conductive rod electrically coupled to the PCB and to the plurality of slots and the base portion via the excitation port.

3. The antenna of claim 2, wherein the PCB is configured to simultaneously transmit the at least one excitation signal to the plurality of slots and the base portion via the conductive rod.

4. The antenna of claim 3, wherein the base portion is configured to output electromagnetic radiation responsive to receiving the at least one excitation signal.

5. The antenna of claim 3, wherein a first slot of the plurality of slots is configured to output electromagnetic radiation having a first wavelength responsive to receiving a first excitation signal of the at least one excitation signal.

6. The antenna of claim 5, wherein the first slot is configured to output electromagnetic radiation having a second wavelength responsive to receiving a second excitation signal of the at least one excitation signal.

7. The antenna of claim 6, wherein the first wavelength is approximately twice the second wavelength.

8. The antenna of claim 6, wherein the first wavelength is approximately four times the second wavelength.

9. The antenna of claim 6, wherein a length of the first slot is approximately equal to the first wavelength.

10. The antenna of claim 9, wherein the length of the first slot is approximately equal to one-half of the second wavelength.

11. The antenna of claim 1, wherein each slot of the plurality of slots and the base portion is configured to transmit electromagnetic radiation of a respective resonant frequency responsive to receiving, via the excitation port, an excitation signal having the respective resonant frequency.

12. A method of operating a slot antenna comprising:
   providing, by an excitation port, a first excitation signal to a plurality of slots and a base portion of the slot antenna;
   outputting, by a first slot of the plurality of slots responsive to receiving the first excitation signal, electromagnetic radiation;
   providing, by the excitation port, a second excitation signal to the plurality of slots and the base portion of the slot antenna; and
   outputting, by a second slot of the plurality of slots responsive to receiving the second excitation signal, electromagnetic radiation.

13. The method of claim 12, further comprising:
   providing, by the excitation port, a third excitation signal to the plurality of slots and the base portion of the slot antenna; and
   outputting, by the base portion responsive to receiving the third excitation signal, electromagnetic radiation.

14. The method of claim 12, further comprising providing the first excitation and the second excitation signal to the plurality of slots and the base portion via a conductive rod coupled to the plurality of slots.

15. The method of claim 12, wherein the electromagnetic radiation output by the first slot responsive to receiving the first excitation signal is first electromagnetic radiation, the method further comprising:
   providing, by the excitation port, a third excitation signal to the plurality of slots and the base portion of the slot antenna; and outputting, by the first slot responsive to receiving the third excitation signal, second electromagnetic radiation.

16. The method of claim 15, wherein the first electromagnetic radiation output by the first slot has a resonant wavelength equal to a length of the first slot.

17. The method of claim 16, wherein the second electromagnetic radiation output by the first slot has a resonant wavelength equal to twice the length of the first slot.

18. A wearable audio device comprising:
   an antenna including:
      an excitation port;
      a conductive medium including:
         a plurality of slots, each slot of the plurality of slots being electrically coupled to the excitation port; and
         a base portion being electrically coupled to the excitation port; and
      a printed circuit board configured to transmit and/or receive, via the excitation port, at least one excitation signal to and/or from the plurality of slots and the base portion.

19. The wearable audio device of claim 18, wherein each slot of the plurality of slots and the base portion is configured to transmit electromagnetic radiation of a respective resonant frequency responsive to receiving, via the excitation port, an excitation signal having the respective resonant frequency.

\* \* \* \* \*